(12) United States Patent
Kim et al.

(10) Patent No.: US 10,910,990 B2
(45) Date of Patent: Feb. 2, 2021

(54) SOLAR CELL MODULE

(71) Applicant: LG Electronics Inc., Seoul (KR)

(72) Inventors: Hyunki Kim, Seoul (KR); Kangseok Moon, Seoul (KR); Wonki Yoon, Seoul (KR); Heonmin Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 184 days.

(21) Appl. No.: 15/632,227

(22) Filed: Jun. 23, 2017

(65) Prior Publication Data

US 2018/0145626 A1 May 24, 2018

(30) Foreign Application Priority Data

Nov. 18, 2016 (KR) ........................ 10-2016-0154226

(51) Int. Cl.
*H02S 40/22* (2014.01)
*H01L 31/054* (2014.01)
*H01L 31/055* (2014.01)
*H01L 31/048* (2014.01)
*H02S 20/24* (2014.01)
(Continued)

(52) U.S. Cl.
CPC ............ *H02S 40/22* (2014.12); *G02B 3/0056* (2013.01); *H01L 31/048* (2013.01); *H01L 31/055* (2013.01); *H01L 31/0543* (2014.12); *H01L 31/0547* (2014.12); *H02S 20/24* (2014.12); *H02S 30/10* (2014.12); *Y02B 10/10* (2013.01); *Y02E 10/52* (2013.01)

(58) Field of Classification Search
CPC . H02S 40/20; H02S 40/22; H01L 31/054–056
See application file for complete search history.

(56) References Cited

U.S. PATENT DOCUMENTS 4,029,519 A * 6/1977 Schertz ............... H01L 31/0547
136/246
8,328,403 B1 * 12/2012 Morgan ................... G02B 6/26
362/606
(Continued)

FOREIGN PATENT DOCUMENTS

DE      102008010012    12/2008
JP       1992354378     12/1992
(Continued)

OTHER PUBLICATIONS

Machine translation of JP2013/123015A (Year: 2013).*
Extended European Search Report in European Application No. 17175461.7, dated Dec. 13, 2017, 8 pages.

*Primary Examiner* — Eric B Smith
(74) *Attorney, Agent, or Firm* — Fish & Richardson P.C.

(57) ABSTRACT

The present invention relates to a solar cell module, includes a plurality of solar cells, a concentration unit having a flat surface to which solar light is incident, arranged at a position spaced apart from the solar cells, and configured to concentrate the incident solar light for output, and a reflection unit configured to reflect light between the solar cells, wherein the concentration unit is provided with a reflective region such that solar light concentrated by the concentration unit and output from is trapped between the concentration unit and the reflection unit, and an air gap is formed between the concentration unit and the reflection unit.

17 Claims, 10 Drawing Sheets

(51) Int. Cl.
*H02S 30/10* (2014.01)
*G02B 3/00* (2006.01)

(56) References Cited

U.S. PATENT DOCUMENTS

| | | | |
|---|---|---|---|
| 2008/0048102 A1* | 2/2008 | Kurtz | H01L 31/0547 250/226 |
| 2008/0236664 A1* | 10/2008 | Gibson | B29C 66/24244 136/259 |
| 2009/0126794 A1* | 5/2009 | Dimroth | H01L 31/052 136/259 |
| 2011/0005595 A1 | 1/2011 | Yang et al. | |
| 2012/0261558 A1 | 10/2012 | Forrest et al. | |
| 2013/0314811 A1* | 11/2013 | Liang | G02B 5/10 359/853 |
| 2013/0319524 A1 | 12/2013 | Aspnes et al. | |
| 2014/0352758 A1* | 12/2014 | Moon | H01L 31/052 136/246 |

FOREIGN PATENT DOCUMENTS

| | | |
|---|---|---|
| JP | 1995193267 | 7/1995 |
| JP | 2000101124 | 4/2000 |
| JP | 2001119055 | 4/2001 |
| JP | 2003346927 | 12/2003 |
| JP | 2004-128419 | 4/2004 |
| JP | 2006332113 | 12/2006 |
| JP | 2011-210890 | 10/2011 |
| JP | 2013123015 | 6/2013 |
| JP | 2014165199 | 9/2014 |
| JP | 2015-153836 | 8/2015 |
| KR | 10-2015-0138923 | 12/2015 |
| WO | 200149475 | 7/2001 |
| WO | 2008145111 | 12/2008 |
| WO | WO2013168612 | 11/2013 |
| WO | 2014116498 | 7/2014 |

* cited by examiner

SOLAR CELL MODULE

CROSS-REFERENCE TO RELATED APPLICATION

Pursuant to 35 U.S.C. § 119(a), this application claims the benefit of an earlier filing date of and the right of priority to Korean Application No. 10-2016-0154226, filed on Nov. 18, 2016, the contents of which are incorporated by reference herein in its entirety.

BACKGROUND OF THE INVENTION

1. Field of the Invention

This specification relates to a solar cell module capable of producing electricity by receiving solar light.

2. Background of the Invention

In recent time, as depletion of existing energy resources such as oil or coal is anticipated, the interest in alternative energy sources to replace the existing energy resources is increasing. Among others, a solar cell is highlighted as a next-generation cell that converts solar light energy directly into electric energy using a semiconductor device. However, the solar cell has problems in fabricating costs, conversion efficiency and lifespan.

Meanwhile, recent studies on the solar cell are focusing on technologies related to an improvement of efficiency of the solar cell. In general, the solar cell includes a substrate, and an emitter forming a p-n junction with the substrate, and generates currents using light that is incident on one side surface of the substrate. In this instance, for a smooth current generation in the solar cell, a quantity of incident light should be sufficient. Accordingly, a concentrator solar cell module having a device of concentrating solar light is under development.

The concentrator solar cell module is provided with an optical design for concentration of light, which increases a thickness of the module. And, a tracking apparatus for tracking orbit and altitude of the sun is additionally needed. In addition, the concentrator solar cell module causes a drastic decrease of concentration efficiency upon a generation of misalignment and an increase in costs due to a difficult fabrication. Therefore, the present invention provides a new type of mechanism for concentrating solar light, so as to solve those problems.

SUMMARY OF THE INVENTION

Therefore, an aspect of the detailed description is to provide an apparatus with a new structure, which can increase in electricity generation efficiency and facilitate alignment in a solar cell module of concentrating solar light.

Another aspect of the detailed description is to provide a concentration mechanism, which is capable of increasing concentration efficiency even though having a compact structure, in a solar cell module.

Another aspect of the detailed description is to provide a concentration mechanism, which has a mass production and is capable of fabricating costs, in a solar cell module.

To achieve the problems to be solved in the present invention, a solar cell module according to the present invention solves a misalignment problem of cells and lenses using a structure of concentrating light and trapping the concentrated light using an internal reflection.

In detail, the solar cell module may include a plurality of solar cells, a concentration unit having a flat surface to which solar light is incident, arranged at a position spaced apart from the solar cells, and configured to concentrate the incident solar light for output, and a reflection unit configured to reflect light between the solar cells, wherein the concentration unit is provided with a reflective region such that solar light concentrated by and output from the concentration unit is trapped between the concentration unit and the reflection unit, and an air gap is formed between the concentration unit and the reflection unit.

In an embodiment disclosed herein, the concentration unit may be provided with a plurality of lenses arranged at an opposite side to the flat surface and each formed in a convex shape toward the solar cells. The reflective region may be provided to cover at least part of the lenses to concentrate the solar light, and re-reflect light reflected by the reflection unit. The reflective region may be provided with a plurality of slits through which the incident solar light is output through the lenses.

In an embodiment disclosed herein, the solar cell module according to the present invention may have a structure capable of concentrating every light of orbit and altitude of the sun using a single optical sheet (concentration function) without a tracking apparatus. In detail, the lenses may extend long in one direction and be sequentially arranged in another direction perpendicular to the one direction. As one example, the lenses may be configured as cylindrical lenses with slits and arranged in a sequential manner.

In an embodiment disclosed herein, the concentration unit may be made of a plurality of materials having different refractive indexes. An opposite surface of the flat surface of the concentration unit may be flat, the concentration unit may be configured as a flat lens of concentrating light by the different refractive indexes, and the reflective region may be provided on the opposite surface.

In an embodiment disclosed herein, the reflection unit may include a base substrate, and at least one reflection board arranged to cover the base substrate.

In an embodiment disclosed herein, the air gap may be formed as an empty space without a filling agent. The reflection unit may be coated with a wavelength change material for changing a wavelength of infrared light into a wavelength of visible light.

The solar cell module according to the present invention can concentrate light using lenses with slits, without a solar tracking apparatus. In this instance, the concentration can be carried out at an angle of view of ±25 with respect to a meridian transit altitude. This may result in an increase in a generation amount of electricity.

Also, the concentration can be carried out using slits or apertures, and thus the solar cell module can be fabricated in a more compact and simmer shape. With the use of the air gap, a total reflection of light to the solar cells can be realized between the concentration unit and the reflection unit without a great structural variation.

With the use of the air gap, reflection of light at outer surfaces of cells with failing to be absorbed can also be reduced. In more detail, the cells may be exposed within the air gap, which has a lower refractive index than that of a coated layer formed on the outer surfaces of the cells. This may result in a reduction of a surface loss of the coated layer.

In addition, with the structure of trapping light between the concentration unit and the reflection unit, misalignment may not be caused between the cells and the lenses. Therefore, the cells can have free sizes and shapes and cells with different shapes or sizes can also be used. According to the structure, a yield rate of the solar cell module of concentrating light can be improved, thereby ensuring a mass production.

According to the present invention, the solar cell module can be implemented with a structure capable of increasing a quantity of visible light using a wavelength change material.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that when an element is referred to as being positioned "on" another element, the element can be present on the other element or intervening elements may also be present.

Hereinafter, a solar cell module in accordance with embodiments of the present invention will be described in detail with reference to the accompanying drawings. However, it will be easily understood by those skilled in the art that configurations according to the embodiments disclosed herein can also be applied to apparatuses of generating currents using solar light even though those apparatuses are new types of products to be developed later.

Figure 1:
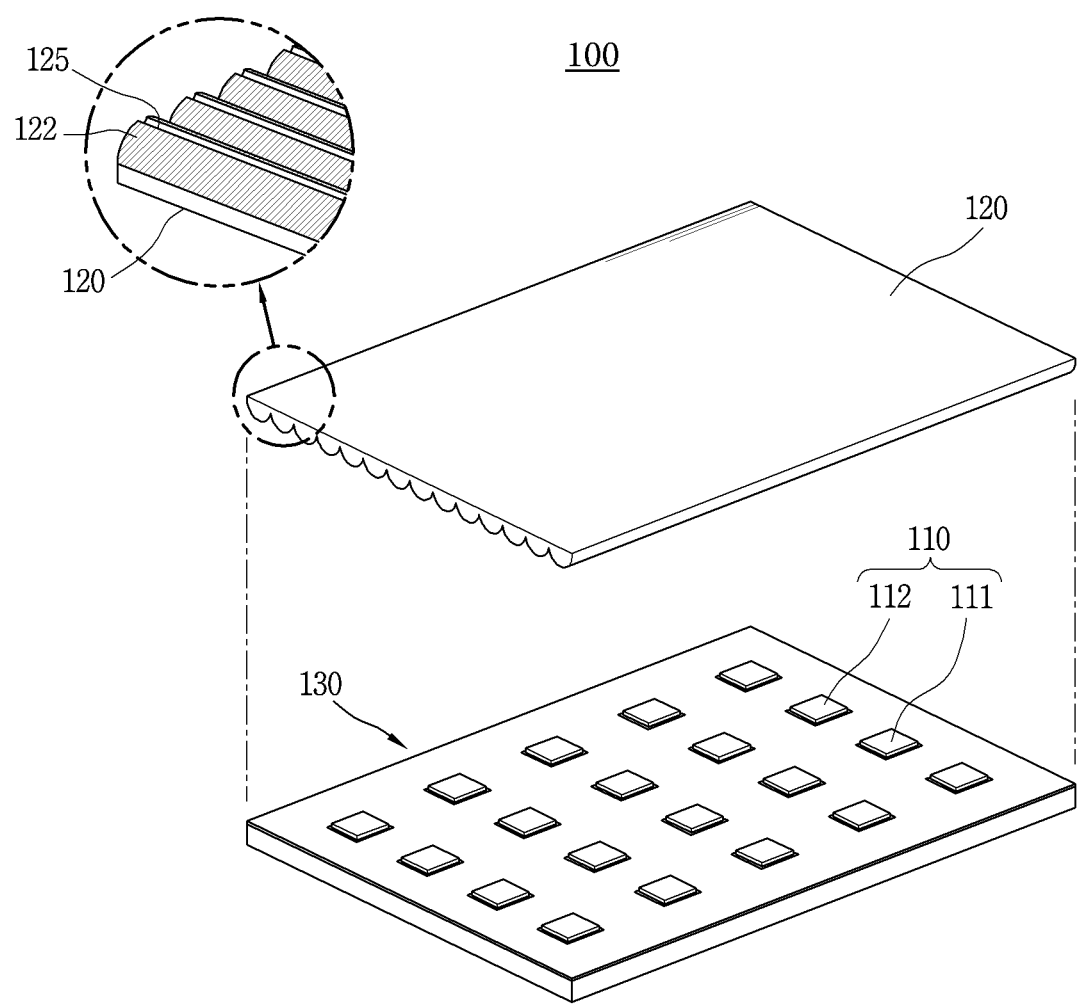
FIG. 1 is a conceptual view of a solar cell module in accordance with one embodiment of the present invention.

FIG. 1 is a conceptual view of a solar cell module in accordance with one embodiment of the present invention.

As illustrated in FIG. 1, a solar cell module 100 according to one embodiment of the present invention may include solar cells 110, a concentration unit 120 and a reflection unit 130.

First, each of the solar cells 110 includes a photoelectric conversion unit that converts solar energy into electric energy, and an electrode electrically connected to the photoelectric conversion unit. This embodiment may employ a photoelectric conversion unit having a semiconductor substrate (e.g., silicon wafer) or a semiconductor layer (e.g., silicon layer).

The solar cells 110 may include ribbons, which allow an electrically serial, parallel or serial-parallel connection. In more detail, electrodes of first and second solar cells 111 and 112 which are adjacent to each other can be electrically connected to each other by the ribbon.

As illustrated, the concentration unit 120 may be a front substrate which is located above a front surface of the solar cells 110 and to which solar light is incident. In this instance, the concentration unit 120 may be implemented as an optical sheet which is arranged to cover the solar cells 110 at a position spaced apart from the solar cells 110 and has a structure of preventing a reflection of solar light and increasing transmissivity. Also, the concentration unit 120 executes an optical function of concentrating solar light and guides the concentrated solar light into the solar cell module. The optical sheet may be set to be 10 mm or less in thickness. In this instance, the concentration unit 120 may be a front substrate which performs such optical function and also protects the solar cells 110 from an external impact or the like.

The reflection unit 130 may be implemented as a rear sheet which supports rear surfaces of the solar cells 110 and has a form of a film or sheet. The rear sheet is a layer of protecting the solar cells 110 on another surfaces of the solar cells 110, namely, executes a waterproofing function, an insulating function and an ultraviolet blocking function. The rear sheet may have a form of film or sheet. In this instance, the reflection unit 130 may be made of a material or structure with superior reflectivity, such that solar light incident from the concentration unit 120 can be reflected for reuse.

The concentration unit 120 can execute a function of trapping within the solar cell module light which is reflected by the reflection unit 130 and then re-reflected to be incident to the solar cell module (or a total reflection function). As such, in the present invention, the concentration unit 120 and the reflection unit 130 may be combined with each other to improve generation efficiencies of the solar cells 110. Hereinafter, a detailed structure of the concentration unit 120 and the reflection unit 130 executing such function will be described in more detail with reference to FIGS. 2 and 3 in addition to FIG. 1.

Figure 2:
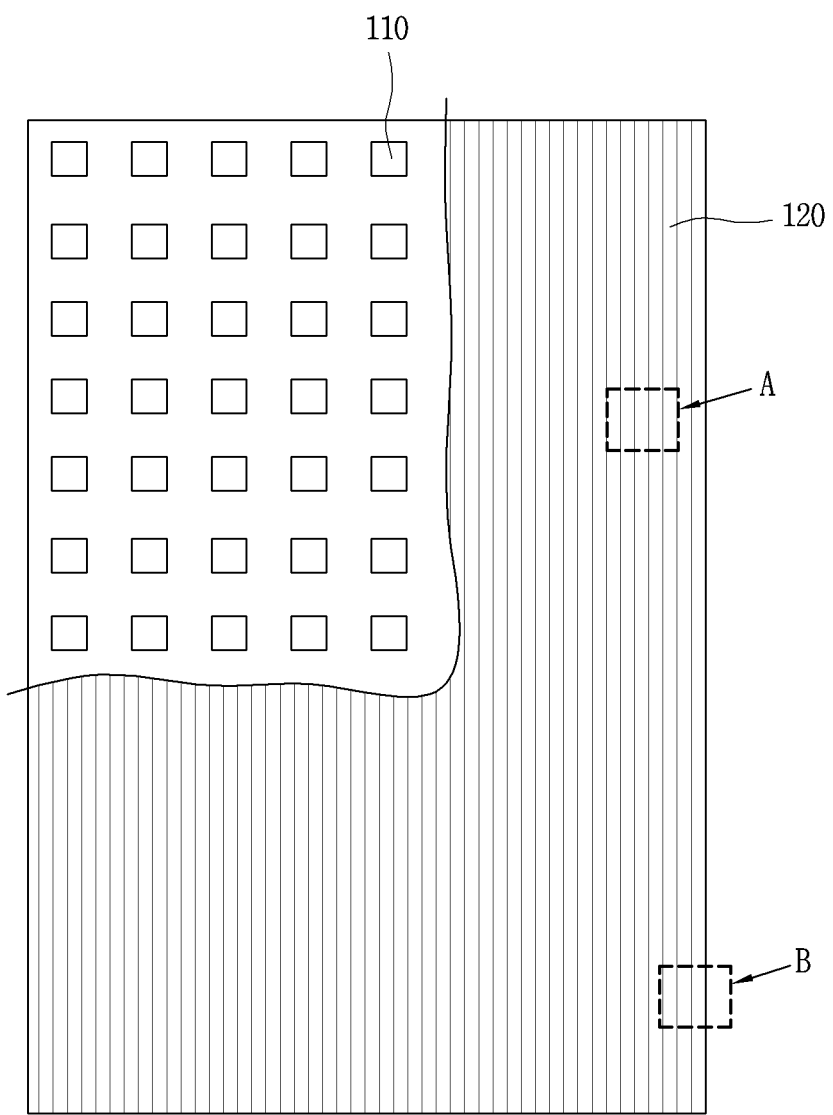
FIG. 2 is a planar view of a concentrating unit of FIG. 1.
Figure 3A:
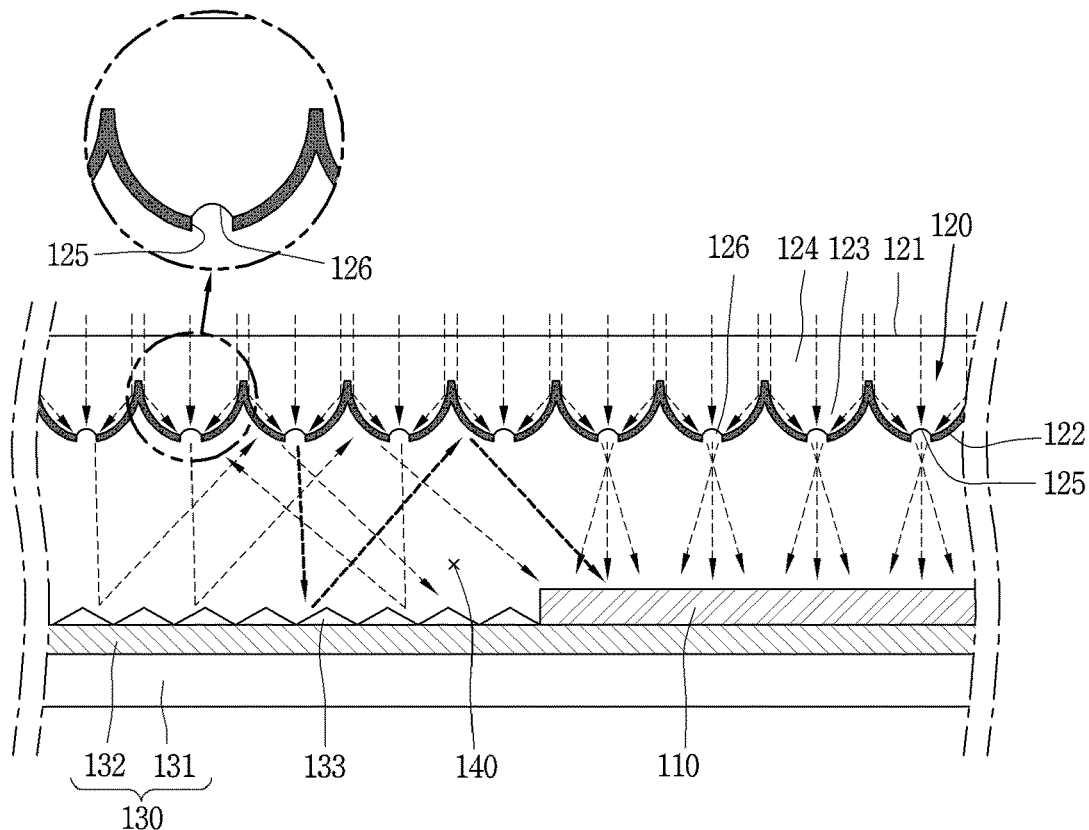
FIG. 3A is a sectional view of a part A of FIG. 2.
Figure 3B:
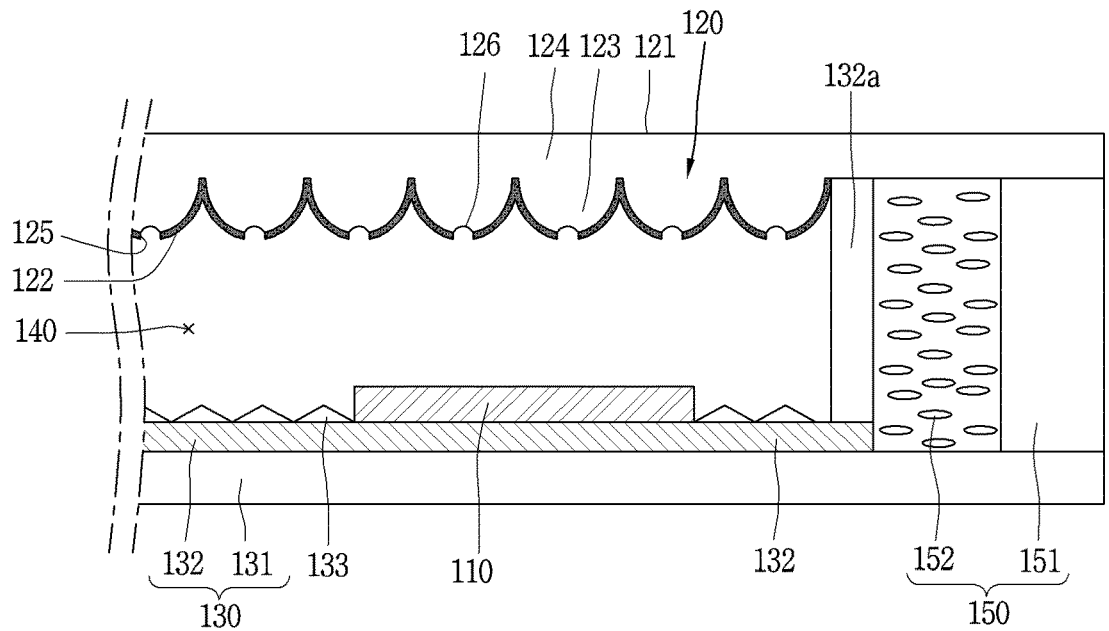
FIG. 3B is a sectional view of a part B of FIG. 2.
Figure 3C:
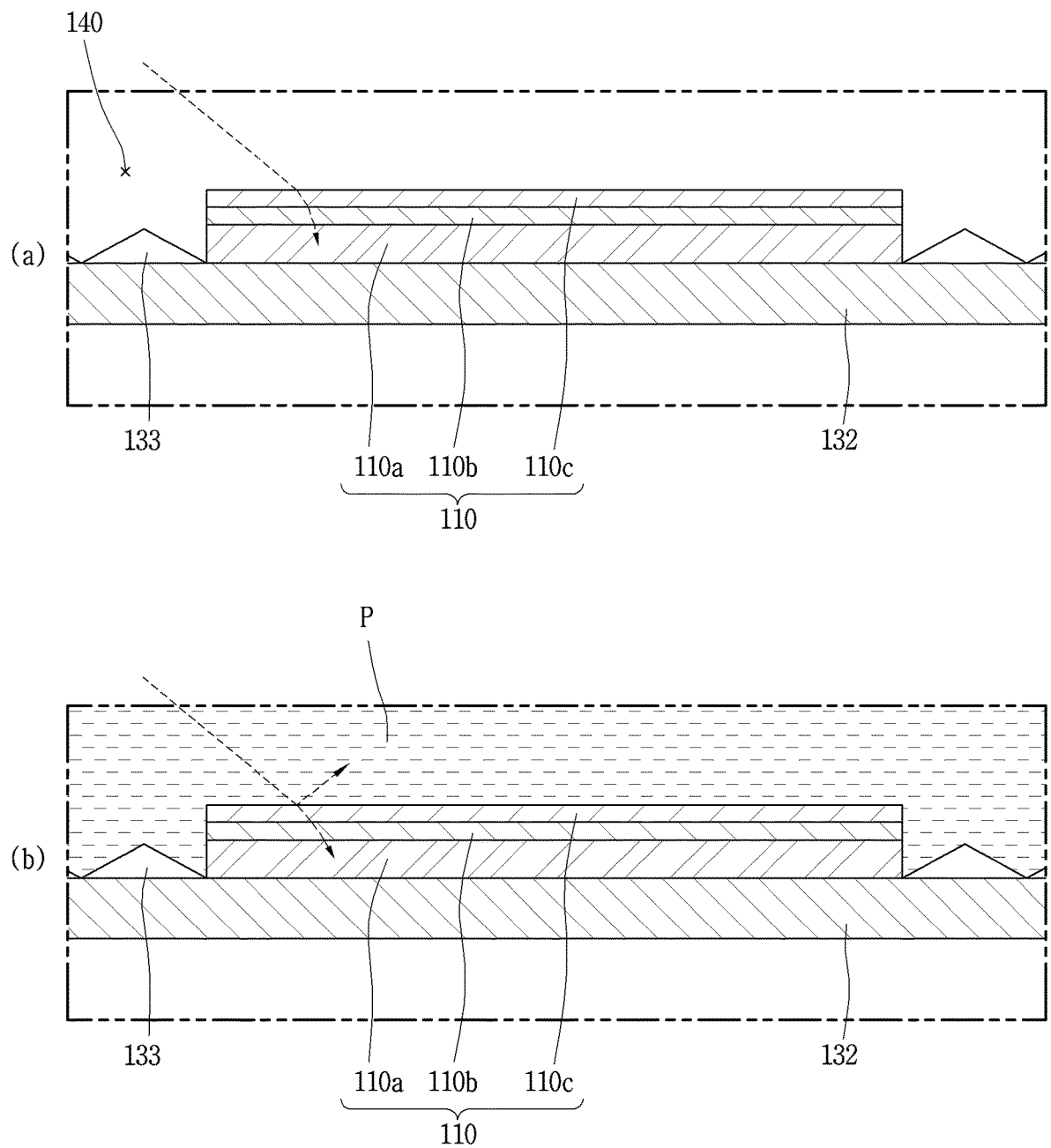
FIG. 3C is a comparative view of a light path when an air gap is present within the solar cell module and a light path when media are filled in the solar cell module.

FIG. 2 is a planar view of the concentrating unit of FIG. 1, FIGS. 3A and 3B are sectional views of parts A and B of FIG. 2, and FIG. 3C is a comparative view of a light path when an air gap is present within the solar cell module and a light path when media are filled in the solar cell module.

As illustrated in FIGS. 1, 2, 3A and 3B, the concentration unit 120 is provided with a flat surface 121 to which solar light is incident, arranged at a position spaced apart from the solar cells 110, and concentrates the incident solar light for output.

In those drawings, since the concentration unit 120 forms an outer surface of the solar cell module, the flat surface 121 forms the outer surface of the solar cell module. Since the outer surface is the flat surface 121, contamination of an incident surface of light due to dust or the like can be reduced.

Also, the concentration unit 120 is provided with a reflective region 122 to re-reflect light reflected by the reflection unit 130. With the structure, the solar light concentrated by and output from the concentration unit 120 is trapped between the concentration unit 120 and the reflection unit 130.

In more detail, the reflective region 122 of the concentration unit 120 and the reflection unit 130 face each other, and thus a total reflection structure can be implemented within the solar cell module. In this instance, the concentration unit 120 is provided with a plurality of lenses 123. The reflective region 122 covers at least part of the lenses 123, to concentrate the solar light and re-reflect the light reflected by the reflection unit 130. For example, the plurality of lenses 123 may be arranged at an opposite side of the flat surface 121 and each may have a convex shape toward the solar cell. For example, the concentration unit 120 may be provided with a base member 124 and the lenses 123 may protrude from the base member 124.

The base member 124, which is a plate-like sheet made of a light-transmissive material, may be made of polymers, such as glass, polycarbonate (PC), poly methyl meta acrylate (PMMA), silicon and the like. Also, the base member 124 may be made of low-iron tempered glass which contains less iron to prevent reflection of solar light and enhance transmissivity of solar light. However, the present invention may not be limited to this. The base member 124 may alternatively be made of a different material.

The lenses 123 may have a shape of lens provided on a lower side of the base member 124. Therefore, the lenses may be made of the same material as the base member to be integrated with the base member. However, the present invention may not be necessarily limited to this. The lenses may alternatively be a member with a separate lens shape attached on a lower surface of the base member 124.

Referring to the drawings, the lenses match the solar cells in the ratio of many to one. However, the present invention may not be necessarily limited to this. The lenses may alternatively be provided in the ratio of one to one with respect to the solar cells.

The lenses 123 may be convex lenses. The reflective region 122 may be formed by coating a mirror on rear surfaces (portions adjacent to the solar cells) of the convex lenses. As another example, the reflective region 122 may be formed by attaching a reflective sheet or a reflective film on the lenses 123.

The reflective region 122 is formed along a convex shape of the convex lens, and thus forms a concave shape with a width gradually decreasing in a direction that solar light is incident. In this instance, thickness and area of the convex lens may be set based on a focal length. With the structure, incident light is reflected by the reflective region 122 to be concentrated toward a lower end portion of the convex lens. Also, a mirror is coated on a side surface of each convex lens and thus a portion without the mirror coated may be formed on the lower end portion of the convex lens. This structure may be implemented by coating the mirror on the outer surface of each lens 123 except for a part of the end portion. Accordingly, the reflective region 122 is provided with a plurality of apertures such that the incident solar light is output through the lenses 123.

Referring to the drawings, each aperture forms a gap, through which light is output, on the mirror-coated portion, and thus may be a slit. That is, the reflective region 122 is provided with slits 125 through which the incident solar light is output.

The slits 125 may be formed by masking corresponding portions when coating the reflective region. As another example, when the reflective region is formed of a reflective sheet or reflective film, the slits 125 may be formed by punching the reflective sheet or reflective film by a desired width. The punching may be executed through knife or laser machining. In this instance, the convex lens may be configured to concentrate collimated light to be collected at the slits 125. As one example, stops of the lenses 123 may be located at the slits 125, and light may focus on the slits 125. Also, the lenses 123 may be arranged to face the slits 125, respectively. That is, the convex lenses and the slits 125 may have a one-to-one correspondence. As such, in this embodiment, since the slit is formed on the lens, a degree of freedom of an angle can increase. Accordingly, the solar cells do not have to be separately aligned.

As a more detailed example, the slits 125 form the gaps on the reflective region 122, and light is transmitted through the slits 125. In this instance, the slits 125 extend long in one direction and are sequentially arranged in another direction perpendicular to the one direction. Therefore, the lenses 123 may extend long in the one direction and be sequentially arranged in the another direction. Accordingly, each of the lenses 123 may be implemented as a lens in a cylindrical shape. In this instance, the one direction may be an east to west direction, and the another direction may be a south to north direction. Therefore, the slits 125 can always face the sun irrespective of a position of the sun on the time basis. In more detail, according to the structure, the concentration can be executed regardless of changes in the meridian transit altitude of the sun. This results from that light is incident in an inclined direction in summer and winter when the solar cell module is installed in a manner that light is perpendicularly incident in spring and fall, but the light is reflected from the reflective region and concentrated toward the lower end portion.

In this instance, at least one of the base member 124 and the lenses 123 may also be made of a gradient-index (GRIN) optical material. The GRIN optical material, which is a material that has a gradually changing refractive index, may be formed in a manner that the refractive index has a gradient of a parabola along an incident direction of solar light. With the structure, the solar light can be concentrated on the slits more easily while moving along a thickness direction of the concentration unit.

Meanwhile, the size of each of the slits 125 may be set within 60% of a diameter of the lens 123. As a related example, the size of the slit 125 may be in the range of 0.1% to 60% of the diameter of the lens 123. In more detail, the slit is very difficult to be fabricated when a width of the slit is less than 0.1% of the diameter of the lens, and the concentration efficiency is drastically lowered when the width of the slit exceeds 5% of the diameter of the lens. Therefore, the width of each of the slits 125 may be in the range of 0.1 to 5% of the diameter of the lens 123. Consequently, an area of the slits 125 may be set to be less than 5% of an area of the flat surface. With the structure, the concentration efficiency can sufficiently be ensured even without a great area or sizes of the slits 125.

Also, recesses 126 which are recessed toward the flat surface may be formed at portions of the lenses 123 corresponding to the slits 125. Each of the recesses 126 may be formed by aligning an optical axis of the lens with a center of the slit using an align mark.

Each of the recesses 126 may be formed on at least part of each slit, and have a bottom surface formed in a curved shape. The recesses 126 may be formed long in one direction, similar to the slits. The recesses 126 may allow light concentrated on the slits 125 to be more spread toward the solar cells.

Meanwhile, as illustrated, the reflection unit 130 may be provided with a base substrate 131 and a reflection board 132.

The base substrate 131 is a substrate supporting the solar cells, and may be made of a material, such as glass, polycarbonate (PC), poly methyl meta acrylate (PMMA) and the like. As another example, the base substrate 131, which is a layer protecting the solar cells 110, may be a tedler/PET/tedler (TPT) type or may have a structure that poly vinylidene fluoride (PVDF) resin or the like is disposed on at least one surface of poly ethylene terephthalate (PET). Accordingly, the base substrate 131 can perform waterproofing, insulating and ultraviolet blocking functions.

The reflection board 132 may be a plate-like reflective sheet attached on an upper surface of the base substrate 131 or a coated layer on the upper surface. In this instance, the solar cells may be mounted entirely on one surface of the base substrate 131 and the reflection board 132 may be disposed on the one surface. As illustrated, the reflection board 132 may be entirely formed on the upper surface of the base substrate 131 and the solar cells may be arranged on the upper surface of the reflection board 132. With the structure, the reflection board 132 reflects light that goes between the solar cells. However, the present invention may not be necessarily limited to this. For example, the solar cells are arranged on the upper surface of the base substrate 132 and the reflection board 132 is disposed between the solar cells. In relation to this, a structure with solar cells and reflection boards according to another embodiment will be described later in more detail with reference to FIG. 7B.

In this instance, the reflection board 132 may be provided with a plurality of protrusions. A bellows or concave-convex structure can be implemented on the reflection board 132 by the plurality of protrusions 133. This may allow light to be reflected toward a wider range.

The light reflected by the reflection unit 130 may be re-reflected at a region of the concentration unit 120 except for the slits 125. Accordingly, light transmitted through the concentration unit 120 is trapped between the concentration unit 120 and the reflection unit 130. That is, the light transmitted through the concentration unit 120 can be absorbed into cells while being recycled within the solar cell module.

In this instance, an air gap 140 is formed between the concentration unit 120 and the reflection unit 130. The air gap 140 may be formed as an empty space without a filling agent. In this instance, the empty space may be filled with only air, filled with an inert gas such as Ar, or filled with a mixture of the air and the inert gas. The solar cell module typically has a structure of filling the empty space with a material such as resin or the like. However, this embodiment illustrates that the empty space filled with the air or inert gas is formed between the concentration unit and the reflection unit of the aforementioned structure, to reduce or prevent a leakage of light due to a difference of a refractive index. The refractive index of the air may be about 1 and the refractive index of the concentration unit may be set as a value (e.g., 1.3 to 1.5) greater than the refractive index of the air. Accordingly, the leakage of light from the slits can be reduced or prevented.

Also, since the light concentrated by the concentration unit can be introduced into the air, an angle of light refracted from the concentration unit toward the solar cell can more increase than that in case where a medium with a higher refractive index than that of the air is filled in the empty space. This may result in obtaining an effect of more concentrating light toward the solar cell.

Meanwhile, with the existence of the air in the empty space, a loss of light incident to the solar cells can be reduced. However, the present invention may not be necessarily limited to this. For example, by filling the inert gas, the inert gas may exist within the empty space. Referring to FIG. 3C, when an air gap is present within the solar cell module, light is incident from the air with the low refractive index to a reflection-preventing layer with a high refractive index. This may more facilitate absorption of light.

The solar cell according to this embodiment may be a gallium arsenide solar cell or a silicon solar cell, and have a structure with a reflection-preventing layer on an outer surface thereof. This embodiment mainly illustrates that the solar cell is the gallium arsenide solar cell.

For example, the gallium arsenide solar cell 110 may have a structure that the reflection-preventing layer having a refractive index which is lower than that of GaAs but higher than that of air is formed on an outer surface of a GaAs layer 110a.

As another example, the silicon solar cell can also have a structure that the reflection-preventing layer is formed on an outer surface of a Si layer. For example, the reflection-preventing layer may be made of a material, such as SiOx, SiNx, AlxOy, MgF2, ZnS and the like, which are generally used in the solar cell. In this instance, the reflection-preventing layer may be used as a single layer, or form a plurality of layers to more increase light absorption within the cell. Here, the reflection-preventing layer may be provided with a first layer 110b of ZnS and a second layer 110c of MgF2.

FIG. 3C briefly illustrates a typical solar cell (an electrode not illustrated). As illustrated in (a) of FIG. 3C, GaAs has a refractive index of about 3.4, ZnS has a refractive index of about 2.38, MgF2 has a refractive index of about 1.38 and air covering MgF2 has a refractive index of 1. Accordingly, when light is incident from the air gap 140 to the second layer 110c, the first layer 110b and a GaAs layer 110a in a sequential manner, the refractive index gradually increases along a path of the light. Therefore, a very less amount of light is lost.

On the other hand, as illustrated in (b) of FIG. 3C, when a medium is filled instead of air, the refractive indexes of the MgF2 and the medium are rarely different from each other or have a minus difference therebetween. In this instance, a surface loss of the reflection-preventing layer of the solar cell may increase. As a related example, when the medium is a polymer P, the refractive index is about 1.3 to 1.5. Therefore, when light is incident from the polymer P to the second layer 110c, the refractive indexes of the polymer and the MgF2 are rarely different from each other or have a minus difference therebetwen. Therefore, light reflection on the surface of the solar cell more increases.

Similarly, the reflection-preventing layer formed on the silicon solar cell may be provided with a single layer or a plurality of layers made of a material (e.g., SiNx) having a lower refractive index than the solar cell, so as to absorb more light into the solar cell.

Meanwhile, a thickness of the air gap may be more than ½ of a width W of the solar cell. In more detail, a distance H between the solar cell or reflection board and the slit may be more than ½ of the width W of the solar cell, and thus a space for totally reflecting light can sufficiently be ensured. As a related example, a distance between the concentration unit 120 and the reflection unit 130 may be less than 50 mm.

Also, a sealing member 150 for sealing the air gap 140 may be disposed at edges of the concentration unit 120 and the reflection unit 130. In this instance, the sealing member 150 may have a double-sealing structure to which a high wetproof material is applied. As a related example, the sealing member 150 may include a first member 151 disposed at an outer side and a second member 152 disposed at an inner side.

The first member 151 is formed of a material such as thermoplastic starch (TPS), silicon, thermoplastic elastomer (TPE) and the like, and attached on the base substrate 131 to support the concentration unit 120. Accordingly, the first member 151 may define an outer wall of the solar cell module.

The second member 152 may have a structure that a dehumidifying (hygroscopic, wetting) agent is mixed with a rubber material such as polyisobutylene (FIB). The second member 152, similar to the first member 151, is mounted on the base substrate 131 to support the concentration unit 120, and closely adhered on the first member 151 on an inner wall of the first member 151. In this instance, the reflection board 132 of the reflection unit 130 may be provided with an extending portion 132a that extends from the base substrate 131 toward the concentration unit 120 to cover an inner wall of the second member 152.

The sealing member 150 may be implemented in a manner of attaching cells on the base substrate 131 or the reflection board 132 and then bonding the front substrate including the concentration unit 120. That is, the concentration unit 120 is separately fabricated, and the sealing member 150 is attached on the base substrate 131. Afterwards, the concentration unit 120 is bonded to the sealing member 150, thereby forming the air gap.

With the structure, the solar cell module which has the air gap and has the reflecting, sealing and dehumidifying structure provided along the edges can be implemented.

As such, the solar cell module according to the present invention enables the light concentration, without a solar tracking apparatus, by use of the lenses with the slits. In addition, the solar cell module according to the present invention can have the solar cells with free sizes and shapes by virtue of the structure of trapping light using the concentration unit and the reflection unit, and also use cells with different shapes or sizes.

Meanwhile, the structure of more improving the concentration efficiency in the solar cell module according to the present invention may also vary. As a related example, a structure without the recesses 126 can be employed. Hereinafter, this structure will be described with reference to FIG. 4.

Figure 4:
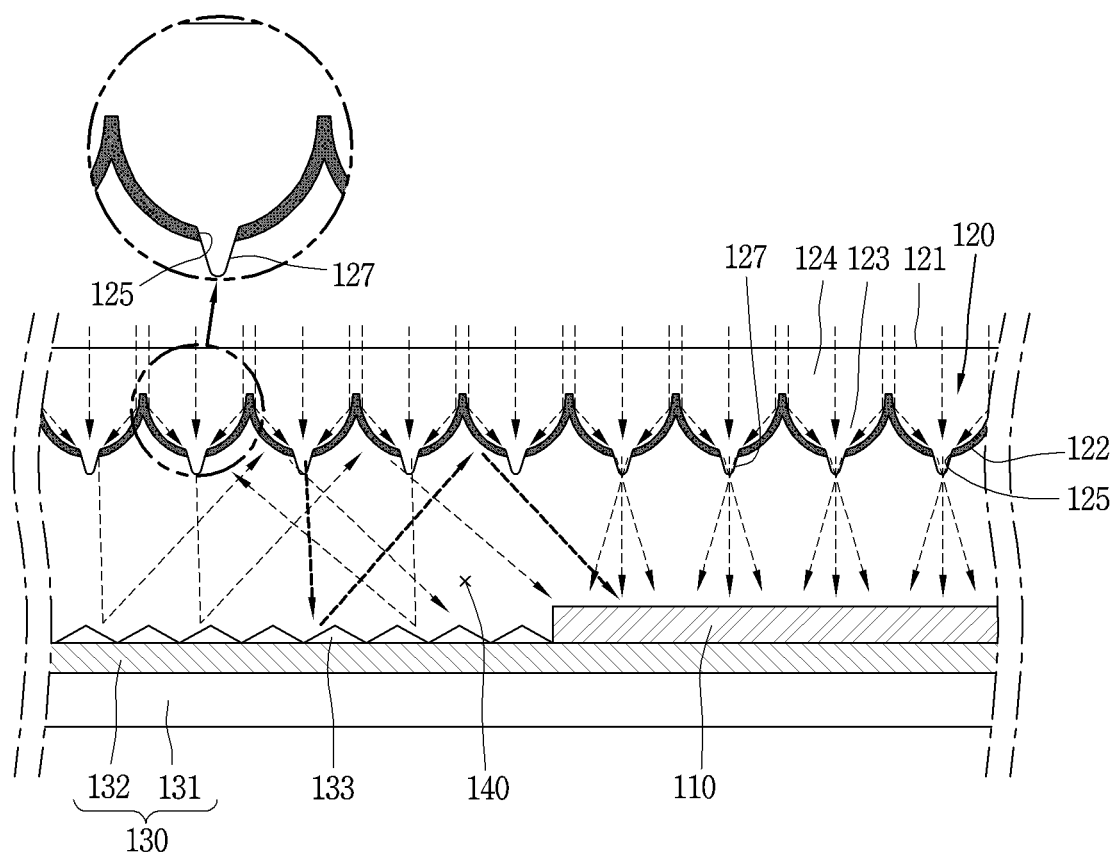
FIG. 4 is a sectional view of a solar cell module with a concentrating unit in accordance with another embodiment of the present invention.

FIG. 4 is a sectional view of a solar cell module with a concentrating unit in accordance with another embodiment of the present invention.

A solar cell module according to this embodiment, similar to the embodiment described with reference to FIGS. 1 to 3, may include solar cells 110, a concentration unit 120 and a reflection unit 130, and the solar cells 110 and the reflection unit 130 may have the same structures as those illustrated in the foregoing embodiment. Therefore, description thereof will be omitted. Also, the structure, in which the concentration unit 120 is provided with the flat surface 121 receiving incident solar light, the plurality of lenses 123, the reflective region 122 and the slits 125, may be the same as that illustrated in the foregoing embodiment. Therefore, description thereof will also be omitted.

As illustrated in FIG. 4, portions of the lenses 123 corresponding to the slits 125 may be provided with protrusions 127 protruding toward the solar cells 110, respectively. Each of the protrusions 127 may be formed on at least part of each of the slits 125. The protrusion 127 may protrude from an end of the corresponding lens 123 in a manner that its width is gradually tapered in a direction toward the solar cell 110. Also, the protrusions 127 may be formed long in one direction, similar to the slits. Therefore, with the structure, light concentrated on the slits 125 by the protrusions 127 can more easily be spread toward the solar cells 110, and an external light leakage through the slits 125 within the air gap can be prevented.

Meanwhile, the foregoing description has been given under assumption that the solar cell module has the convex lenses each in the cylindrical shape, but is the shape of the solar cell module may be changed into another shape. Hereinafter, structures of solar cell modules with different concentration units according to different embodiments will be described. FIGS. 5A to 7B are sectional views of solar cell modules each having a concentration unit according to a different embodiment of the present invention.

Figure 5A:
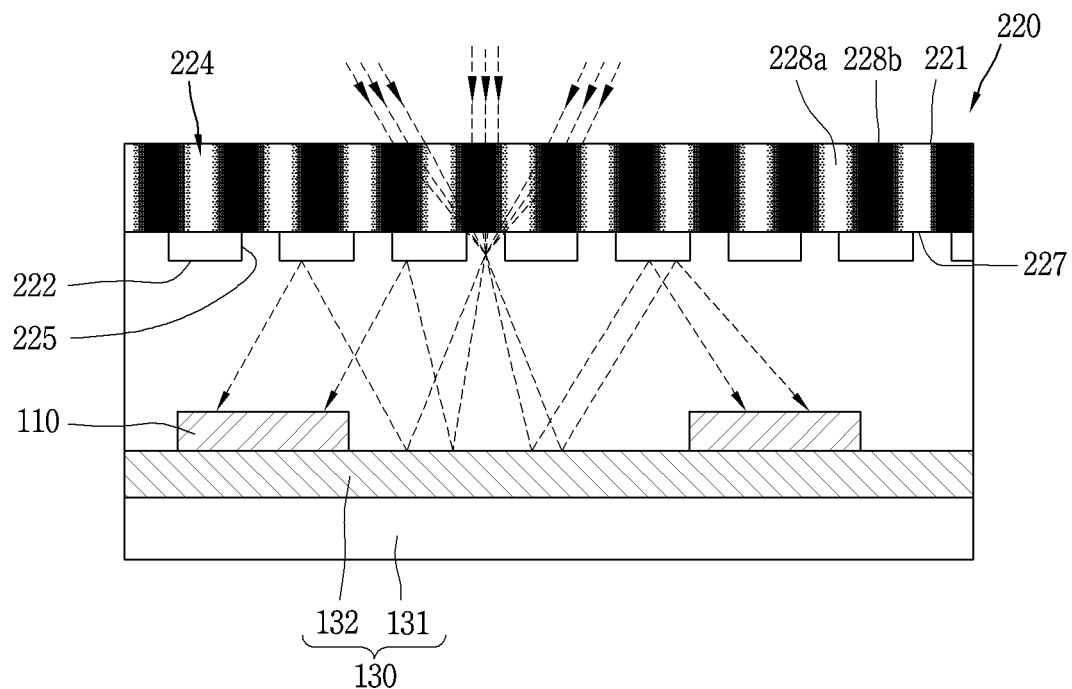
FIGS. 5A and 5B are sectional views of a solar cell module with a concentrating unit implemented as a flat lens in accordance with another embodiment of the present invention.
Figure 5B:
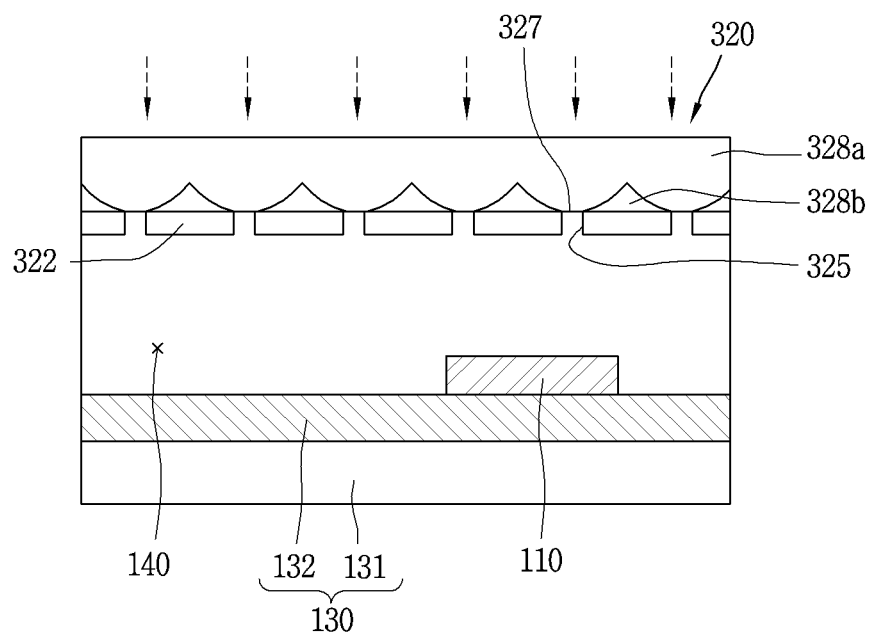

As illustrated in FIGS. 5A and 5B, a concentration unit 220 may be configured in a form of a flat lens which has an incident surface and an exit surface both in a flat shape. In this instance, similar to the aforementioned embodiment, the solar cell module may include solar cells 110, a concentration unit 220 and a reflection unit 130, and the solar cell 110 and the reflection unit 130 may have the same structures as those illustrated in the foregoing embodiment, description of which will thusly be omitted.

The concentration unit 220 according to this embodiment is arranged to cover the solar cells 110 at a spaced position from the solar cells 110, and made of a plurality of materials with different refractive indexes.

The concentration unit 220 includes a flat surface 221 to which solar light is incident. The concentration unit 220 is arranged at a position spaced apart from the solar cells 110, and concentrates the incident solar light for output.

As illustrated, since the concentration unit 220 defines an outer surface of the solar cell module, the flat surface 221 defines the outer surface of the solar cell module. Since the outer surface is the flat surface 221, contamination of an incident surface to which light is incident due to dust or the like can be reduced. In this instance, the flat surface 221 may be referred to as an outer plane.

Also, an opposite surface of the flat surface 221 of the concentration unit 220 is a flat surface 227 (hereinafter, referred to as an inner plane), and the concentration unit 220 is configured as a flat lens of concentrating light by the different refractive indexes.

As an example, referring to FIG. 5A, first parts 228a and second parts 228b formed of materials with different refractive indexes may be sequentially arranged in a lengthwise direction (perpendicular direction to a thickness direction) of the concentration unit 220. In this instance, the first parts 228a and the second parts 228b are sequentially arranged at predetermined intervals.

The first part 228a is a portion having a high refractive index and the second part 228b is a portion having a low refractive index. The refractive indexes may be decided in the range of 1.2 to 3.4. That is, the low refractive index may be equal to or higher than 1.2 and the high refractive index may be equal to or lower than 3.4.

As illustrated, a reflective region 222 may be formed on the inner plane 227 of the concentration unit 220. That is, a base member 224 in a shape of a plate is configured as a lens of concentrating light. The reflective region 222 is formed to cover at least part of the inner plane 227 of the base member 224, so as to concentrate the solar light and re-reflect light that has been reflected by the reflection unit 130.

The reflective region 222 may be a reflective sheet attached on a lower surface of the base member 224 or a coated layer that is a mirror-coated on the inner plane 227. For the reflective sheet, the reflective region 222 may be fabricated using MCPET which is a polyethylene terephthalate reflective sheet.

In this instance, the reflective region 222 may be divided into a plurality of regions, and gaps may be formed between the adjacent regions. By virtue of the gaps, a plurality of slits 225 may be formed on the reflective region 222. In this instance, the slits 225 extend long in one direction and are sequentially arranged in another direction perpendicular to the one direction. The first parts 228a and the second parts 228b may be sequentially arranged along the another direction, such that the solar light can be concentrated toward the slits 225. Here, the one direction may be an east to west direction, and the another direction may be a south to north direction. Therefore, the slits 225 can always face the sun, irrespective of a position of the sun on the time basis.

As another example, as illustrated in FIG. 5B, a first part 328a and a second part 328b formed of materials with different refractive indexes may be sequentially arranged in a thickness direction of a concentration unit 320.

The first part 328a which is a portion having a high refractive index may be arranged at an upper side and the second part 328b which is a portion having a low refractive index may be arranged at a lower side. Similar to the embodiment of FIG. 4, the refractive indexes of the first part 328a and the second part 328b may be decided in the range of 1.2 to 3.4.

In this instance, the first part 328a may be provided with a plurality of convex lenses, and made of gradient-index (GRIN) optical material for concentration of solar light. For example, the first part 328a, as illustrated with reference to FIGS. 3A and 3B, may be configured such that an upper side thereof is flat and a lower side thereof is convex.

The second part 328b covers the convex lenses to fill gaps between the adjacent convex lenses. With the structure, the second part 328b may define an inner plane 327. A reflective region 322 is formed on the inner plane 327 and slits 325 may be formed on the reflective region 322 at positions corresponding to the plurality of convex lenses.

According to the structure, the concentration unit may be implemented as the flat lens but the present invention may not be limited to this. Hereinafter, different embodiments of the concentration unit according to the present invention will be described with reference to the accompanying drawings.

Figure 6:
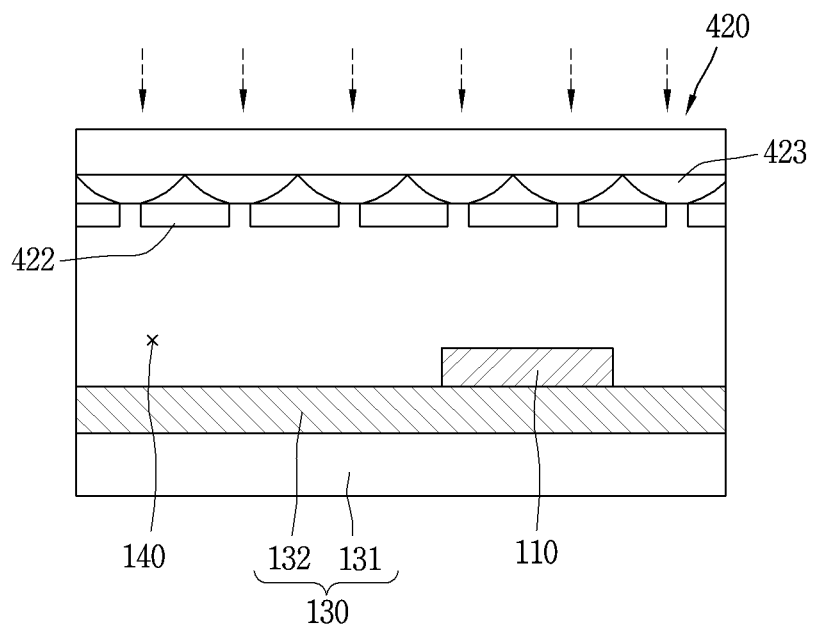
FIG. 6 is a sectional view of a solar cell module with a concentrating unit in accordance with another embodiment of the present invention.

As another example, as illustrated in FIG. 6, a concentration unit 420 may be provided with fisheye lenses 423. The fisheye lenses may extend long in one direction, be sequentially arranged in another direction perpendicular to the one direction. Therefore, the fisheye lenses may have a cylindrical shape.

A reflective sheet 422 having slits may be arranged at a lower side of the fisheye lenses 423, and in this instance, the reflective sheet 422 may be provided as the aforementioned reflective region. In this instance, the fisheye lenses 423 concentrate light on the slits, and thus the fisheye lenses 423 and the reflective sheet 422 function as the concentration unit.

Figure 7A:
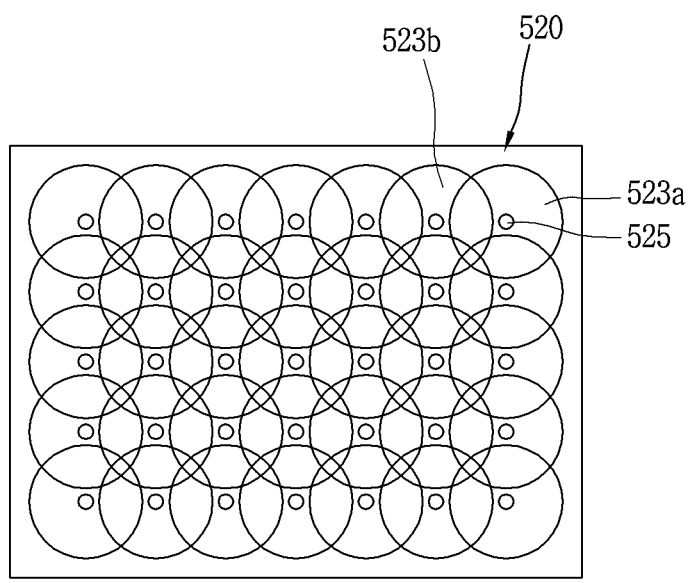
FIGS. 7A and 7B are a planar view and a sectional view of a solar cell module with a concentrating unit in accordance with another embodiment of the present invention.
Figure 7B:
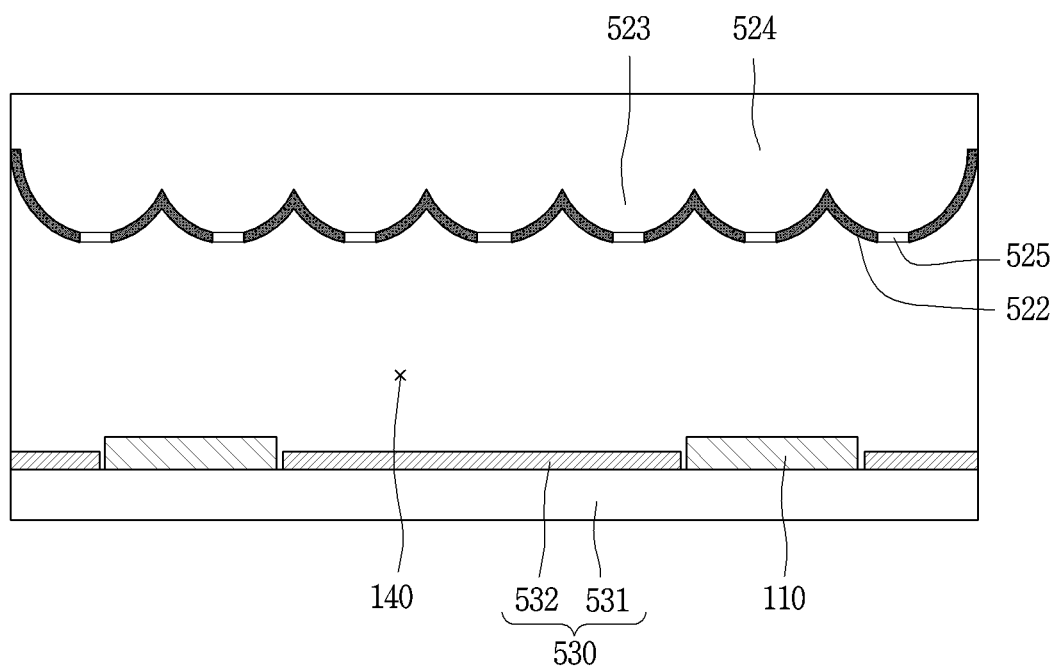

As another example, as illustrated in FIGS. 7A and 7B, a concentration unit 520 is arranged to cover the solar cells 110 at a position spaced apart from the solar cells 110, and provided with through holes 525, a reflective region 522 and a lens 523.

The lens 523 may include a plurality of unit lenses 523a that protrude from a lower surface of a base member 524. Each of the unit lenses 523a may overlap the adjacent unit lens 523b. The unit lenses 523a are configured as convex lenses, and the reflective region 522 is formed on convex surfaces to concentrate light toward centers of the unit lenses 523a.

The reflective region 522 is provided with the through holes 525 at positions corresponding to the centers of the unit lenses 523a, respectively. In this instance, light is transmitted through the through holes 525. Also, light that is incident into the solar cell module through the concentration unit can be externally reflected only through the through holes 525. This may implement a structure in which an almost total reflection is allowed within the solar cell module.

As such, according to the present invention, light concentration can be carried out by using slits or through holes (apertures), and thus a more compact or slimmer solar cell module can be fabricated.

Meanwhile, the reflection unit 530 may have a structure of arranging reflection boards 532 between the adjacent solar cells 110. However, the present invention may not be necessarily limited to this. A structure of arranging the solar cell on an upper surface of the reflection board may also be implemented. As illustrated, the reflection boards 532 may be arranged on an upper surface of a base substrate 531 together with the solar cells. In this instance, the reflection board 532 may be formed to substantially fill a space between the adjacent solar cells 110. The reflection board 532 may be a plate-like reflective sheet or a coated layer coated on the base substrate.

With the structure, the solar cells 110 and the reflection boards 532 may be arranged on the same plane and provided to cover the base substrate 531.

As such, the reflection unit according to the present invention may be varied into various shapes. As an additional example, FIGS. 8A and 8B are sectional views of a solar cell module with a reflection unit in accordance with another embodiment of the present invention.

Figure 8A:
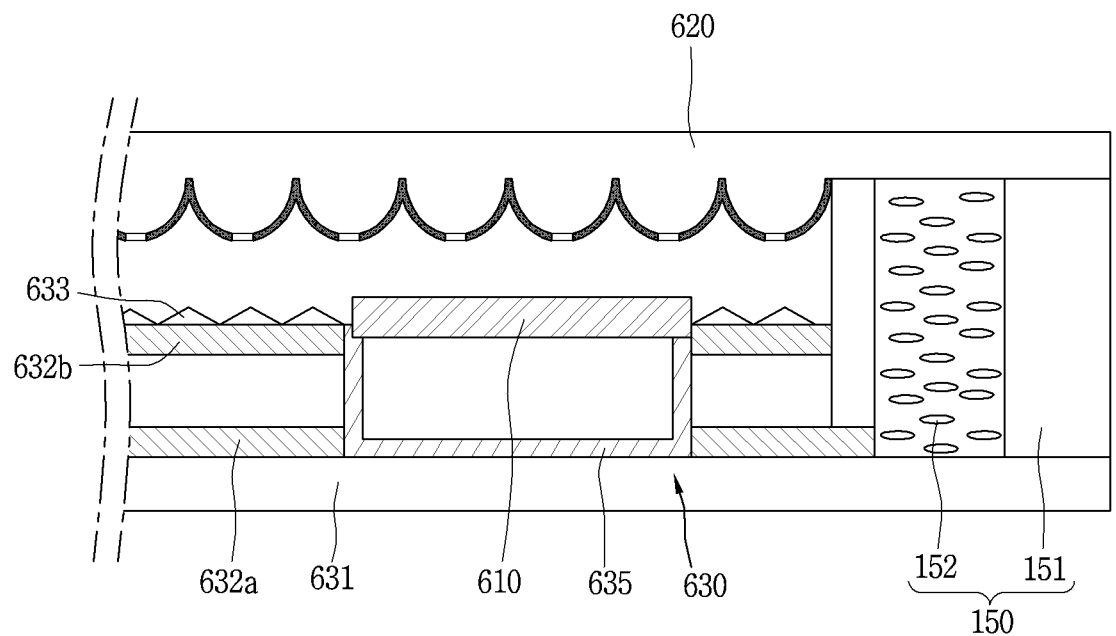
FIGS. 8A and 8B are sectional views of a solar cell module with a reflecting unit in accordance with another embodiment of the present invention.
Figure 8B:
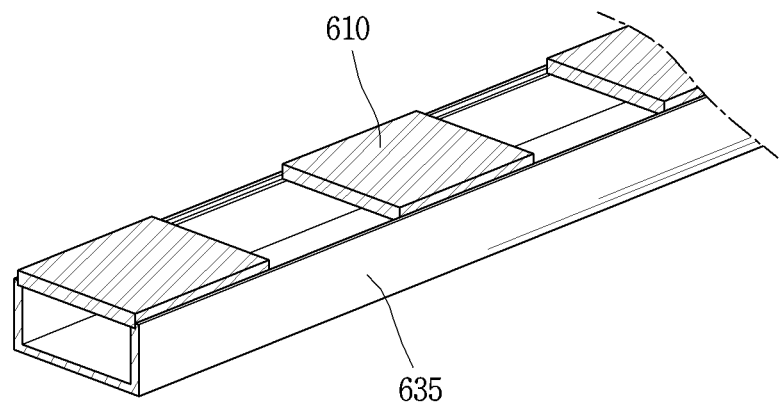

As illustrated in FIGS. 8A and 8B, a reflection unit 630 may support rear surfaces of the solar cells 610 and be implemented as a rear sheet in a form of a film or sheet. The rear sheet is a layer of protecting the solar cells 610 on another surfaces of the solar cells 110, and performs waterproofing, insulation and ultraviolet blocking functions. The rear sheet may be configured in a form of a film or sheet. In this instance, the reflection unit 630 may be made of a material or have a structure providing high reflectivity, such that solar light concentrated and incident from the concentration unit 620 can be reflected for recycle.

In this instance, similar to the aforementioned embodiment, the solar cell module may include solar cells 610, a concentration unit 620 and a reflection unit 630. The concentration unit 620 may have the same structure as those illustrated in the embodiments of FIGS. 1 to 7, so description thereof will be omitted.

The solar cell 610 according to this embodiment may be configured as a bifacial cell which can generate electricity by absorbing solar light from both of upper and lower surfaces thereof. Also, the solar cells 610 may be located side by side with second reflection boards 632b such that upper surfaces thereof face the concentration unit 620 and lower surfaces thereof face first reflection boards 632a.

The base substrate 631 is a substrate for supporting the solar cell module, and may be made of a material, such as glass, polycarbonate (PC), poly methyl meta acrylate (PMMA) and the like. As another example, the base substrate 631 is a layer of protecting the solar cell module, and may be a tedler/PET/tedler (TPT) type or have poly vinylidene fluoride (PVDF) resin or the like, which is disposed on at least one surface of polyethylene terephthalate (PET), so as to perform waterproofing, insulating and ultraviolet blocking functions.

The first reflection board 632a may be a plate-like reflective sheet attached on an upper surface of the base substrate 631, or a coated layer coated on the upper surface.

The second reflection boards 632b are arranged together with the solar cells between the base substrate 631 and the concentration unit. In this instance, the solar cells 110 are disposed between the adjacent second reflection boards 632b. Thus, gaps between the solar cells are filled, which allows a reflection of light passing between the solar cells. In this instance, each of the second reflection boards 632b may be provided with a plurality of protrusions 633. By the formation of the plurality of protrusions 633, a bellows or concave-convex structure can be implemented on the second reflection board 632b, thereby realizing a wider reflection range of light.

Meanwhile, a supporting member 635 for supporting the second reflection boards 632b and the solar cells 610 may be provided within the solar cell module. The supporting member 635 which is a mounting frame in a shape of a ladder may be mounted on the base substrate 631, at least part of the supporting member 635 may protrude toward the concentration unit 620, and the solar cells 610 may be mounted on the protruded portion.

Also, the supporting member 635 may be made of a light-transmissive material such that light can be transmitted therethrough to be incident to rear surfaces of the solar cells 610. Here, the supporting member 635 is formed as an empty space filled with air. This may more facilitate light to be incident to the rear surfaces of the solar cells 610.

With the structure, light can be trapped at both of upper and lower sides of the solar cells, thereby more increasing a quantity of electricity generated by the solar cells.

Meanwhile, the solar cell module according to the present invention can be varied into various shapes. Hereinafter, those variations will be described by adding varied characteristics based on the embodiment of FIG. 2. However, those variations may not be necessarily limited to those characteristics, but may also be applicable to those embodiments of FIGS. 4 to 8.

Figure 9:
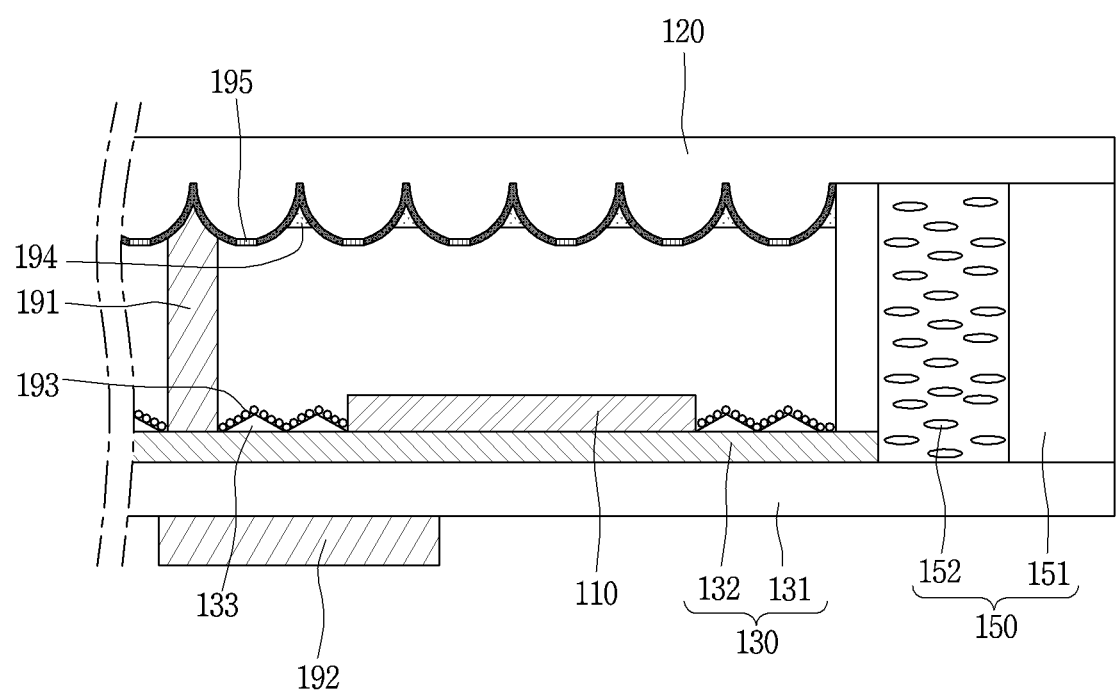
FIG. 9 is a sectional view of a solar cell module in accordance with a variation of the present invention.

FIG. 9 is a sectional view of a solar cell module in accordance with variations of the present invention.

In this instance, the solar cell module, similar to the foregoing embodiments, may include the solar cells 110, the concentration unit 120 and the reflection unit 130, which may have one of the structures illustrated the aforementioned embodiments described with reference to FIGS. 1 to 8, but this embodiment will be illustratively described based on the embodiment of FIG. 2. Therefore, description thereof will be omitted.

As illustrated in FIG. 9, spacers 191 may be disposed between the concentration unit 120 and the reflection unit 130 to maintain the empty space of the air gap. The spacers 191 are mounted on the reflection unit 130 to support the concentration unit 120. In more detail, the spacers 191 may be mounted on the base substrate 131 or the reflection board 132 of the reflection unit 130, and protrude in a thickness direction of the solar cell module to support the concentration unit 120.

The present invention has the structure in which the plurality of lenses and slits concentrate light toward one solar cell, and thus the concentration unit 120 may be formed in a shape of a wide plate. Therefore, the spacers 191 support the wide plate so as to reinforce rigidity.

Also, for the reinforcement of the rigidity, reinforcing members 192 may be disposed on a lower surface of the base substrate 131. The reinforcing members 192 as plate-like members are mounted on a part of the base substrate 131 and brought into contact with the lower surface of the base substrate 131 to reinforce the rigidity.

Also, as illustrated, the reflection unit 130 may be coated with a wavelength change material 193 for changing a wavelength of infrared light into a wavelength of visible light. The wavelength change material 193 may be a fluorescent substance combined using er3+ or yb3+ as a lanthanide series material, for example.

Solar light contains infrared light but the solar cell uses visible light for generating electricity. Accordingly, a quantity of electricity can increase by converting the infrared light into the visible light. In this instance, a light path may randomly change in response to light being scattered by the wavelength change material 193, but the structure according to this embodiment recycles the light into the solar cell module. Therefore, a reduction of electricity generation efficiency is not observed.

Also, a filling member 194 may be disposed between the adjacent lenses 123 to fill at least part of the gap formed between the adjacent lenses 123. The filling member 194 may be made of a material which has a different refractive index from that of the concentration unit 120. The filling member 194 is provided to remove a dead space between the lenses 123, and covers at least part of the reflective region 122. In addition, the plurality of slits may be filled with a light-transmissive material 195, thereby enabling an adjustment of the refractive index.

The solar cell module described above may not be limited to those configurations and methods of the aforementioned embodiments, but all or part of each of the embodiments can selectively be combined such that many variations and changes can be made from the embodiments.

Therefore, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A solar cell module, comprising:
   a plurality of solar cells;
   a concentration unit arranged at a position spaced apart from the plurality of solar cells, a first side of the concentration unit forming a flat surface configured to receive incident solar light, and a second side of the concentration unit facing a direction opposite the first side and towards the plurality of solar cells, the concentration unit configured to concentrate the incident solar light and output concentrated solar light from the second side; and
   a reflection unit arranged at a position spaced apart from the second side of the concentration unit, the reflection unit configured to face the second side of the concentration unit and to reflect, towards the second side of the concentration unit and through spaces defined between the plurality of solar cells, light that is incident upon the reflection unit,
   wherein the second side of the concentration unit is provided with a reflective region that faces the reflection unit and the plurality of solar cells and that is configured to trap, in an air gap defined between the concentration unit and the reflection unit, at least a portion of the concentrated solar light that is output from the second side of the concentration unit,
   wherein the concentration unit comprises a plurality of lenses arranged at the second side of the concentration unit, each of the plurality of lenses having a convex shape toward the plurality of solar cells,
   wherein the reflective region on the second side of the concentration unit covers at least a part of the plurality of lenses, extends along the convex shape of each of the plurality of lenses, and defines a plurality of slits that are disposed at a lower end portion of each the plurality of lenses and that are configured to output the concentrated solar light,
   wherein the reflective region on the second side of the concentration unit is configured to:
      concentrate the incident solar light that is incident on the first side of the concentration unit and output the concentrated solar light from the second side of the concentration unit, and
      re-reflect the light that is reflected by the reflection unit and that is incident on the second side of the concentration unit,
   wherein the air gap defined between the concentration unit and the reflection unit is formed as an empty space without a filling agent,
   wherein the solar cell module further comprises a sealing member that is disposed along edges of the concentration unit and along edges of the reflection unit and that is configured to seal the air gap defined between the concentration unit and the reflection unit,
   wherein the sealing member extends from the concentration unit and is attached to the reflection unit, and
   wherein the sealing member comprises a first sealing member facing opposite to the air gap, and a second sealing member disposed between the air gap and the first sealing member.

2. The module of claim 1, wherein an aggregate area of the plurality of slits on the reflective region is 0.1% to 5% of an area of the flat surface of the concentration unit.

3. The module of claim 1, wherein each of the plurality of lenses in the concentration unit corresponds to a respective one of the plurality of slits on the reflective region on the second side of the concentration unit, and each lens is provided with a recess that is recessed away from the respective slit and toward the flat surface on the first side of the concentration unit.

4. The module of claim 1, wherein the plurality of slits on the reflective region of the concentration unit are filled with a light-transmissive material.

5. The module of claim 1, wherein the plurality of lenses in the concentration unit are arranged with each of the plurality of lenses extending lengthwise along a first direction and the plurality of lenses being sequentially arranged along a second direction perpendicular to the first direction.

6. The module of claim 1, wherein the plurality of lenses are arranged adjacent to each other, and a filling member is arranged between adjacent lenses among the plurality of lenses to fill at least part of a gap formed between the adjacent lenses among the plurality of lenses.

7. The module of claim 1, wherein the concentration unit comprises a plurality of materials having different refractive indexes.

8. The module of claim 7, wherein the second side of the concentration unit comprises a flat surface, the concentration unit is a flat lens configured to concentrate light by the different refractive indexes of the plurality of materials in the concentration unit, and the reflective region is provided on the flat surface of the second side of the concentration unit.

9. The module of claim 7, wherein the different refractive indexes of the plurality of materials in the concentration unit are in a range of 1.2 to 3.4.

10. The module of claim 1, wherein the reflection unit that is arranged at the position spaced apart from the second side of the concentration unit comprises:
    a base substrate; and
    at least one reflection board arranged to cover the base substrate.

11. The module of claim 10, wherein the plurality of solar cells are mounted on a first surface of the base substrate and the at least one reflection board is disposed on the first surface.

12. The module of claim 10, wherein the at least one reflection board comprises:
    first reflection boards that are arranged on the base substrate; and
    second reflection boards that are disposed, together with the plurality of solar cells, between the base substrate and the concentration unit.

13. The module of claim 10, wherein each of the at least one reflection board is provided with a plurality of protrusions.

14. The module of claim 1, further comprising spacers that are disposed between the concentration unit and the reflection unit and that are configured to maintain the empty space between the concentration unit and the reflection unit.

15. The module of claim 1, wherein the reflection unit is coated with a wavelength converting material configured to convert a wavelength of infrared light into a wavelength of visible light.

16. The module of claim 1, wherein the reflective region faces and contacts an outer surface of each of the plurality of lenses.

17. The module of claim 1, wherein the first sealing member is made of thermoplastic starch, silicon, or thermoplastic elastomer, and
 wherein the second sealing member is made of polyisobutylene.

* * * * *